United States Patent
Hiratsuka et al.

(10) Patent No.: US 7,301,097 B2
(45) Date of Patent: Nov. 27, 2007

(54) PRINTED-CIRCUIT BOARD AND ELECTRONIC DEVICE

(75) Inventors: Yoshiaki Hiratsuka, Kawasaki (JP); Yoshiro Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/017,712

(22) Filed: Dec. 22, 2004

(65) Prior Publication Data

US 2005/0213309 A1 Sep. 29, 2005

(30) Foreign Application Priority Data

Mar. 23, 2004 (JP) .............................. 2004-085781

(51) Int. Cl.
*H05K 9/00* (2006.01)
(52) U.S. Cl. ..................... 174/35 R; 174/260; 174/262; 361/816; 361/818
(58) Field of Classification Search ............. 174/35 R, 174/250–268, 260, 262; 361/816, 818
See application file for complete search history.

(56) References Cited

U.S. PATENT DOCUMENTS

| | | | | |
|---|---|---|---|---|
| 5,270,493 A | * | 12/1993 | Inoue et al. ................ | 174/253 |
| 5,592,391 A | * | 1/1997 | Muyshondt et al. .......... | 716/15 |
| 5,761,049 A | * | 6/1998 | Yoshidome et al. ........ | 361/782 |
| 6,418,032 B2 | * | 7/2002 | Hirata et al. ................ | 361/780 |
| 6,707,682 B2 | * | 3/2004 | Akiba et al. ................ | 361/763 |
| 6,717,494 B2 | * | 4/2004 | Kikuchi et al. ............ | 333/243 |
| 6,937,480 B2 | * | 8/2005 | Iguchi et al. ............... | 361/780 |

FOREIGN PATENT DOCUMENTS

| | | |
|---|---|---|
| JP | 5-275863 | 10/1993 |
| JP | 2003-272467 | 9/2003 |

\* cited by examiner

*Primary Examiner*—Cathy F. Lam
(74) *Attorney, Agent, or Firm*—Staas & Halsey LLP

(57) ABSTRACT

A printed-circuit board includes a shield pattern layer that is stacked on a surface layer with respect to at least one wiring pattern layer that includes a wide-pattern area having a wiring width of more than 1 millimeter. Moreover, the shield pattern layer includes a shield pattern that is, from a plane view, overlapped on the wide-pattern area, and grounded without being electrically connected to an internal layer of other wiring pattern layers.

5 Claims, 3 Drawing Sheets

US 7,301,097 B2

PRINTED-CIRCUIT BOARD AND ELECTRONIC DEVICE

BACKGROUND OF THE INVENTION

1) Field of the Invention

The present invention relates to a printed-circuit board and an electronic device with the printed-circuit board.

2) Description of the Related Art

An electronic device in which resistance properties against electrostatic noise are strengthened is disclosed in, for example, Patent Application Laid-Open Publication No. 2003-272467. In this conventional electronic device, a printed-circuit board is covered by a metallic chassis to avoid an adverse effect due to electrostatic noise.

However, the metallic chassis has some shortcomings of causing an increase in cost and an increase in weight of the printed-circuit board.

SUMMARY OF THE INVENTION

It is an object of the present invention to solve at least the above problems in the conventional technology.

A printed-circuit board according to an aspect of the present invention includes a shield pattern layer that is stacked on a surface layer with respect to at least one wiring pattern layer that includes a wide-pattern area having a wiring width of more than 1 millimeter. The shield pattern layer includes a shield pattern that is, from a plane view, overlapped on the wide-pattern area, and grounded without being electrically connected to an internal layer of other wiring pattern layers.

An electronic device according to another aspect of the present invention includes a device casing that accommodates a printed-circuit board, wherein the printed-circuit board is positioned in such a manner that the shield pattern sandwiched between the base wall and the wiring pattern layer. The printed-circuit board includes a shield pattern layer that is stacked on a surface layer with respect to at least one wiring pattern layer that includes a wide-pattern area having a wiring width of more than 1 millimeter. The shield pattern layer includes a shield pattern that is, from a plane view, overlapped on the wide-pattern area, and grounded without being electrically connected to an internal layer of other wiring pattern layers.

A printed-circuit board according to still another aspect of the present invention includes is a mixture of circuit components mounted on a metallic shell and semiconductor elements. A grounding layer corresponding to the circuit components is formed on a grounding layer of the semiconductor elements which is closest to the surface layer, and the semiconductor element is not electrically connected to the grounding layer which is closest to the surface layer.

The other objects, features, and advantages of the present invention are specifically set forth in or will become apparent from the following detailed description of the invention when read in conjunction with the accompanying drawings.

DETAILED DESCRIPTION

Exemplary embodiments of a printed-circuit board according to the present invention will be described below with reference to the accompanying drawings.

Figure 1A:
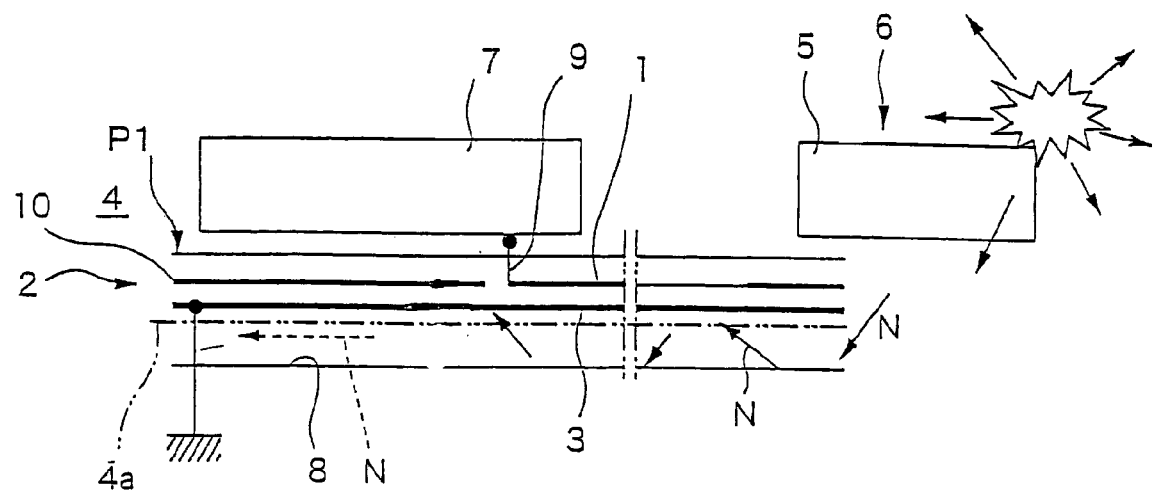
FIG. 1A is a cross-section of a printed-circuit board according to a first embodiment of the present invention.

FIG. 1A is a cross-section of a printed-circuit board according to a first embodiment of the present invention. A printed-circuit board P1 is arranged within a device casing 4 having a base wall 4a. A desktop surface 8 is made of a metal having electrical conductivity.

The printed-circuit board P1 is formed by stacking a plurality of wiring layers that are being sandwiched between a proper insulating material. A semiconductor element 7 and a circuit component 6 having a metallic shell 5 are mounted on a mounting surface of the printed-circuit board P1. The circuit component 6 includes connectors and the like.

To simplify the explanation, the printed-circuit board P1 is assumed to have only one internal wiring layer 10. The internal wiring layer 10 is electrically connected to a surface layer pattern through a via-hole 9. Wires to a power source, a ground, and a signal are arranged in the internal wiring layer 10.

A wide-pattern section 1 is formed on the internal wiring layer 10; and the wide-pattern section 1 has a wiring width of more than 1 millimeter. The example in the drawing illustrates that the wide-pattern section 1 is formed across a considerable or almost total length of the internal wiring layer 10, however, a wide-pattern section having the length of just a few millimeters is sufficient.

A shield pattern layer 2 is formed on a surface layer that is opposite to the base wall 4a of the device casing 4. The shield pattern layer 2 has a shield pattern 3 that is not electrically connected to the internal wiring layer 10. The shield pattern 3 may be electrically connected to a frame ground. The shield pattern 3 is positioned, from a plane view, in overlapping positions on a back surface of the wide-pattern section 1. The shield pattern 3 is formed in an almost identical shape as the wide-pattern section 1, or as a filler pattern.

FIG. 1A illustrates a situation where the wide-pattern section 1 is formed on the surface of the internal wiring layer 10 and the shield pattern 3 is formed as a surface layer. However, it is sufficient that the shield pattern 3 is located between the wide-pattern section 1 and the desktop surface 8. The wide-pattern section 1, for example, may be mounted on a mounting surface of the semiconductor element 7, and the shield pattern 3 in the internal wiring layer 10.

Figure 1B:
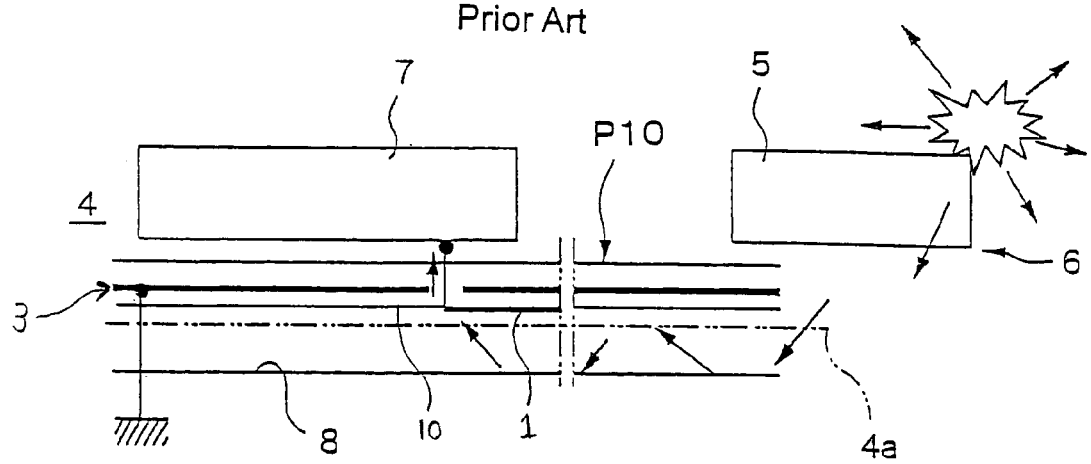
FIG. 1B is a cross-section of a conventional printed-circuit board.

Accordingly, in this embodiment, even if emitted electrostatic noise is reflected between the desktop surface 8 and the base wall of the device casing 4 as the arrows N in FIG. 1A indicate, and although the wide-pattern section 1 functions as an antenna to draw in this electrostatic noise, this electrostatic noise does not enter into a circuit network due to the shield pattern 3. FIG. 1B illustrates a conventional printed-circuit board P10 that has no shield pattern for the wide-pattern section 1. The noise in this printed-circuit board P10 is not blocked and enters into the circuit network.

It is known that noise generated during electrostatic discharge is one of the causes of an electronic device malfunction. Generally, it is unlikely that noise radiating from a discharge origination point is the cause of the malfunction. But, as FIG. 1 illustrates, when the desktop surface 8 has conductive properties and there is a space between the device casing 4 and the base wall 4a, noise is repeatedly reflected between the desktop surface 8 and the device casing 4 and enters the circuitry.

The inventor of the present invention has, as a result of repeating various experiments to reveal the mechanism by which radiated noise progresses along the space between the device casing 4 and base wall 4a to enter the circuitry, found that a wiring width of over 1 millimeter (wide pattern section 1) on the printed-circuit board has a tendency to act as an antenna for the above-mentioned noise.

The present invention is based upon the above-mentioned knowledge. The shield pattern 3, which is placed between the wide pattern section 1 and the desktop surface 8, blocks noise from the wide pattern section 1, which has a strong tendency towards being the entrance for noise, to prevent the entry of noise signals into the circuitry.

Since the shield pattern 3 is grounded independently from the circuitry, fluctuation of the grounding level of the circuitry, which accompanies the entry of noise into the shield pattern 3, is avoided.

Moreover, by using only the printed-circuit board P according to the present invention, shield processing and the like for the device casing 4 becomes unnecessary, making a reduction in cost and in weight of the device feasible.

Figure 2A:
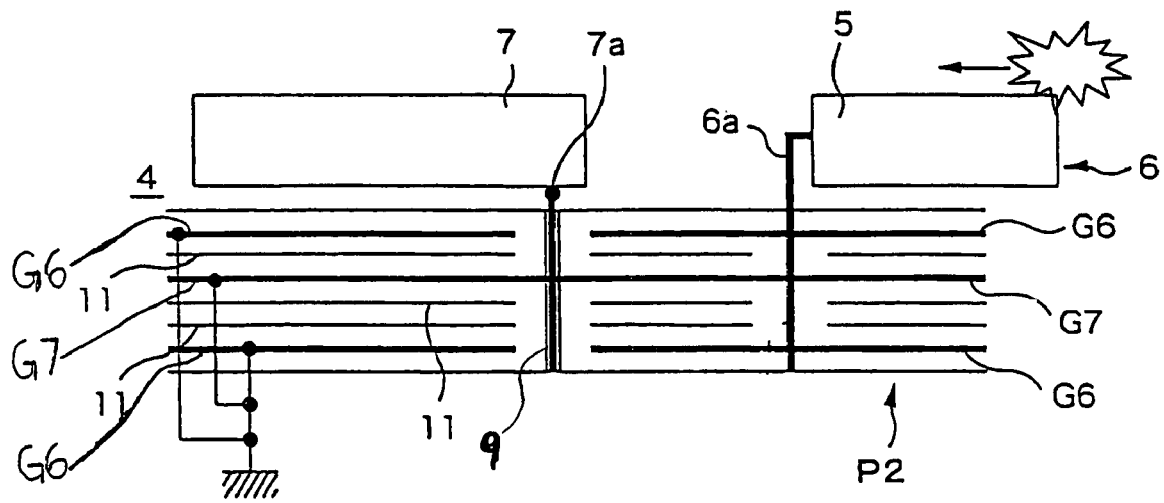
FIG. 2A is a cross-section of a printed-circuit board according to a second embodiment of the present invention.

FIG. 2A illustrates a printed-circuit board P2 according to a second embodiment of the present invention. This embodiment relates to a configuration to prevent a circuit malfunction by preventing a change in reference electrical potential that is caused by an electrostatic discharge. Moreover, in an explanation of the second embodiment, the constituent elements are, for practical purposes, identical to the first embodiment above, so an explanation of the reference signs within the figures illustrating the second embodiment is omitted.

In this second embodiment, three grounding layers, G6, G7, and one more G6, form an internal layer of the printed-circuit board P2; and a wiring layer for signaling 11 is positioned in an intermediate grounding layer (grounding layer G7). Moreover, the circuit component 6 that are mounted using the via-holes, are electrically connected to each of the grounding layers (the two G6 layers and the G7 layer) through a fixed-terminal 6a which also acts as a grounding pin. On the other hand, the grounding pin 7a of the semiconductor element 7 is electrically connected to only the intermediate layer (the grounding layer G7); and the other grounding layers (the two G6 layers) are decoupled.

Therefore, in this second embodiment, when electrostatic charges are generated between the metallic shell 5 and the circuit component 6, this noise (electrostatic charges) is transmitted from the charge-generating section to the surface layer of the printed-circuit board; or is transmitted to an electrically conductive layer (in this embodiment, the grounding layer G6 which was most recently mounted). To respond to the transmission of noise, the grounding layer G7, which is positioned in a more interior layer, is connected to the semiconductor element 7 through the via-hole 9 that has comparatively higher impedance than the two grounding layers G6. Since less noise reaches the grounding layer G7, an adverse effect on the level of grounding of the semiconductor element 7 is avoided.

Figure 2B:
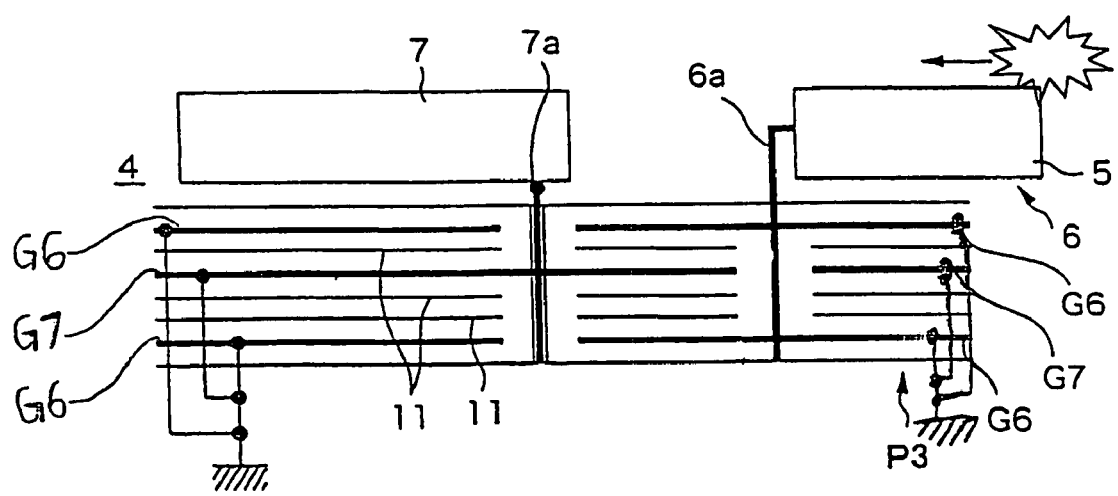
FIG. 2B is a cross-section of a printed-circuit board according to a modification of the printed-circuit board illustrated in FIG. 2A.

FIG. 2B illustrates a printed-circuit board P3 which a modification of the printed-circuit board P2 shown in FIG. 2A. In the printed-circuit board P3, the possibility is taken into consideration that the circuit component 6 that have become electrically charged are on the back surface of the printed-circuit board P3. Although the grounding layer G6 closest to the back surface of the printed-circuit board P3 and the grounding layer 7a closest to the semiconductor element 7 are not in contact, it is possible to decouple the grounding layer G6 closest to the back surface of the printed-circuit board P3, or to connect the grounding layer 7a to the semiconductor element 7 if there is no possibility of noise being transmitted through the grounding layer G6 that is closest to the back surface.

As illustrated in FIG. 2B, when the grounding layer G7 to the semiconductor element 7 is decoupled from a fixing-terminal 6a of the circuit component 6, the danger of a malfunction is further reduced since the transmission of noise through the fixing-terminal 6a is completely blocked.

Figure 3:
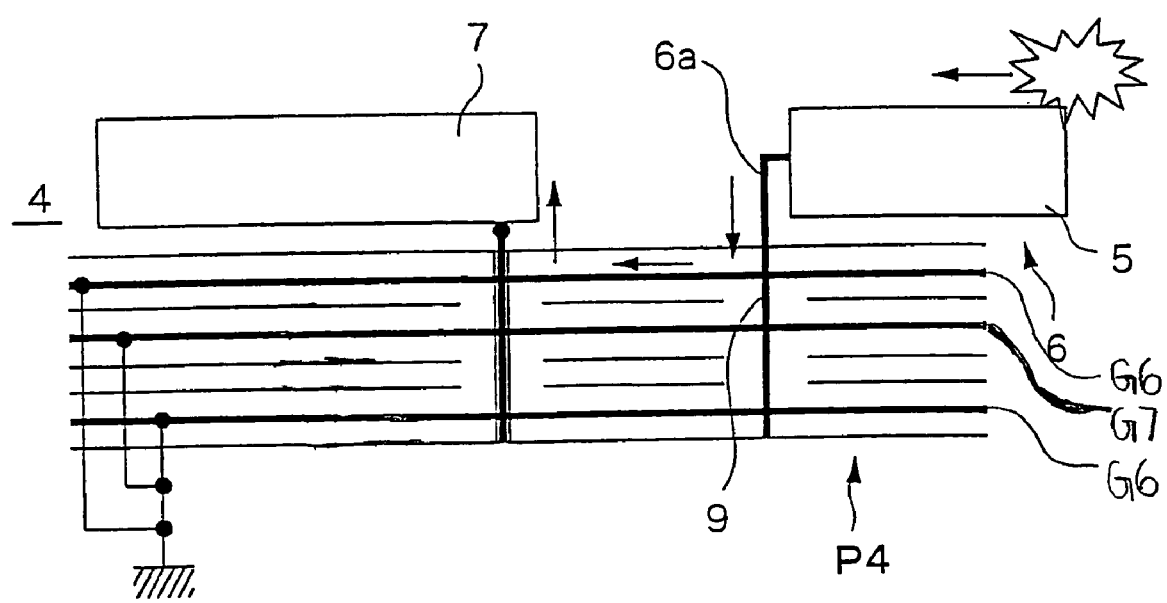
FIG. 3 is a drawing for explaining the effects achieved by the printed-circuit boards illustrated in FIG. 2A or FIG. 2B.

It is known that fluctuation of the grounding level is another mechanism that is a cause of the circuit malfunction due to static electricity. FIG. 3 illustrates a printed-circuit board P4 in which noise enters the grounding layer G6 from the fixing terminals 6a to the metallic shell 5 of the printed-circuit board P4 when an electrostatic discharge is generated between the mounted connectors and the like of the circuit components 6 and the metallic shell 5. The level of electrical potential of the ground fluctuates, and becomes the cause of the malfunction of the semiconductor element 7 that has a low resistance to noise.

There is a grounding layer G6 for the circuit component 6, and the grounding layer G7 for the semiconductor element 7. In the present invention in which the grounding layer G6 for the circuit component 6 is positioned closer to the surface than the grounding layer G7 for the semiconductor element 7, the noise generated on the metallic shell 5, which must pass through the via-hole 9, is given priority for transmission to the deeper grounding layer (grounding layer G7 for the semiconductor component 7), and there is no fluctuation of the reference electrical potential of the semiconductor component 7.

The present invention has an effect of improving resistance properties against electrostatic noise, and reducing a cost and a weight of the printed-circuit board.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A printed-circuit board comprising:
    at least one wiring pattern layer having a wiring width of more than 1 millimeter;
    at least one conductive surface; and
    a shield pattern layer including a shield pattern provided between the at least one wiring pattern layer and the at least one conductive surface, wherein
    the shield pattern layer overlaps an area of the at least one wiring pattern layer.

2. An electronic device comprising:
    a device casing that accommodates a printed-circuit board, wherein the printed-circuit board is positioned in such a manner that a shield pattern is sandwiched between a base wall and a wiring pattern layer; and
    the printed-circuit board includes a shield pattern layer that is stacked with respect to said wiring pattern layer and a conductive surface, wherein said wiring pattern layer has a wiring width of more than 1 millimeter, wherein
the shield pattern layer including the shield pattern provided between said wiring pattern layer and said conductive surface, and the shield pattern layer overlaps an area of said wiring pattern layer.

3. A printed-circuit board that includes circuit components with a metallic shell and semiconductor elements, wherein the printed-circuit board has at least one grounding layer corresponding to the circuit components, the printed-circuit board having at least one grounding layer corresponding to the semiconductor elements, wherein the at least one grounding layer corresponding to the circuit components is closer to a surface layer than the at least one grounding layer corresponding to the semiconductor elements, and, the semiconductor elements are not electrically connected to the grounding layer corresponding to the circuit components.

4. The printed-circuit board according to claim 3, wherein the grounding layer which is furthest away from the surface layer is not electrically connected to the circuit components.

5. A printed-circuit board comprising:

a wiring pattern layer having a wiring width of more than 1 millimeter; and a shield pattern positioned between the wiring pattern layer and a conductive surface, wherein the shield pattern blocks noise from the wiring pattern layer, and the shield pattern overlaps an area of the wiring pattern layer.

\* \* \* \* \*